United States Patent [19]

Matsuura

[11] 4,417,263
[45] Nov. 22, 1983

[54] SEMICONDUCTOR DEVICE
[75] Inventor: Yoshiaki Matsuura, Tokyo, Japan
[73] Assignee: Kabushiki Kaisha Daini Seikosha, Japan
[21] Appl. No.: 225,468
[22] Filed: Jan. 16, 1981
[30] Foreign Application Priority Data
  Feb. 1, 1980 [JP] Japan .................. 55-011021
[51] Int. Cl.³ .......................................... H01L 29/78
[52] U.S. Cl. ........................................ 357/23; 357/28
[58] Field of Search ............. 357/28, 23 R; 307/296, 307/304

[56] References Cited
U.S. PATENT DOCUMENTS
4,321,484 3/1982 Blaser .......................... 307/304 X
4,346,344 8/1982 Blauschild .................... 323/313
4,347,476 8/1982 Tam ............................. 307/304 X Primary Examiner—Martin H. Edlow
Attorney, Agent, or Firm—Robert E. Burns; Emmanuel J. Lobato; Bruce L. Adams

[57] ABSTRACT

A semiconductor device for generating a constant voltage and comprised of a pair of MOS field effect transistors of the same conductivity type connected in series. A first of the transistors is a depletion type and has a gate connected to its source and its source connected to its substrate so as to operate as an active device. The second transistor has a gate connected to its drain and a source connected to its substrate. When a supply voltage is applied across the series combination of the first and second transistors, a constant voltage is developed at the connection node between the first and second transistors.

2 Claims, 13 Drawing Figures

FIG.5  FIG.6  FIG.7  FIG.8  FIG.9
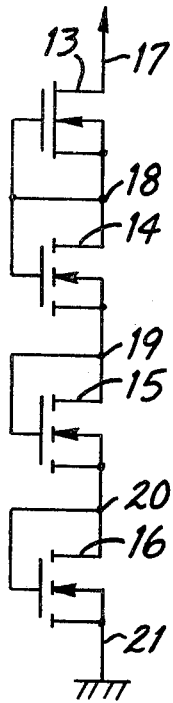
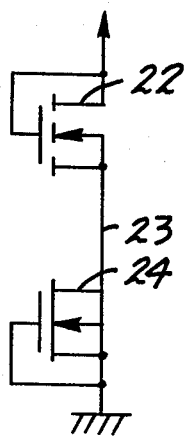
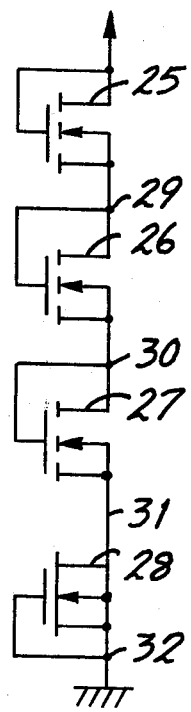
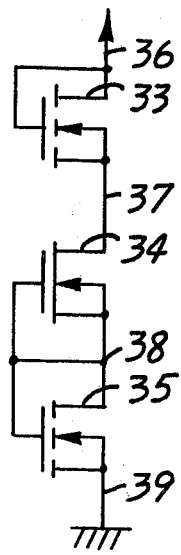
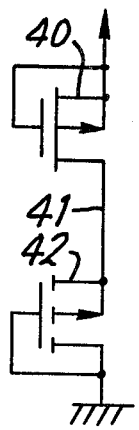
FIG.10  FIG.11  FIG.12  FIG.13
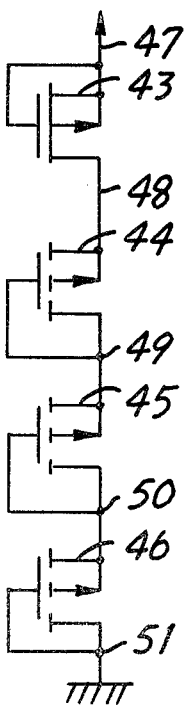
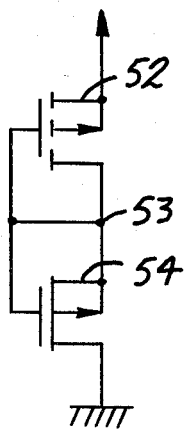
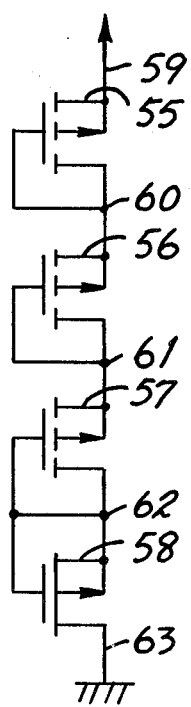
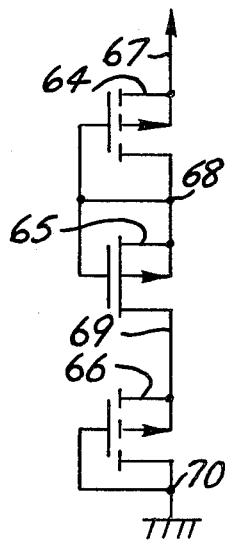

SEMICONDUCTOR DEVICE

BACKGROUND OF THE INVENTION

The present invention relates to a semiconductor device for producing a reference voltage, in which at least two MOS FETs of the same conductivity type which are different in threshold voltage are connected in series.

SUMMARY OF THE INVENTION

An object of the present invention is to produce a voltage which is any integer multiple of the voltage produced at a drain terminal of on MOS FET. The MOS gate is connected to the drain of the MOS, and the source of the MOS is connected to its substrate. The MOS is operated to receive a constant current from a second MOS FET and to develop a constant voltage.

The circuit structure, principle of operation, and features of the present invention will be described by reference to some embodiments of the invention illustrated in the accompanying drawings.

BRIEF DESCRIPTION OF THE DRAWINGS

FIG. 2, FIG. 5, FIG. 6, FIG. 7 and FIG. 8 are circuit diagrams of various embodiments of the present invention employing N channel transistors;

FIG. 9, FIG. 10, FIG. 11, FIG. 12 and FIG. 13 are circuit diagrams of various embodiments of the present invention employing P channel transistors;

DETAILED DESCRIPTION OF THE INVENTION

Figure 1:
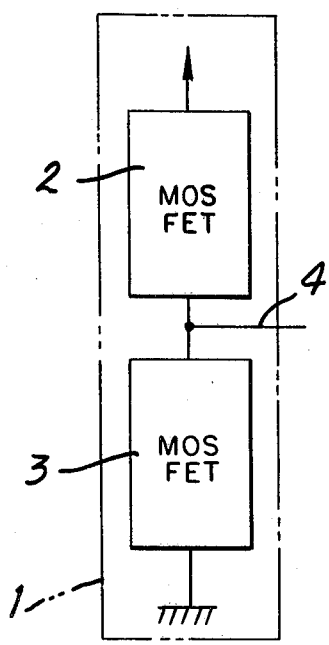
FIG. 1 is a block diagram illustrating the basic of the semiconductor device of the present invention.

FIG. 1 illustrates the structure of a semiconductor device of the present invention. Basically, either a block 2 or a block 3 is a depletion type MOS FET in which a source is connected to a gate and the other block is a MOS FET in which a gate is connected to a drain to produce a constant volatage at an output terminal 4.

Figure 2:
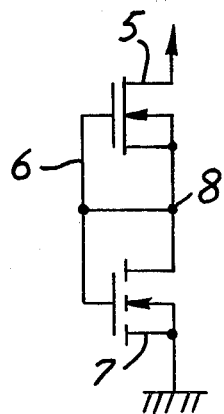

It is possible to connect in series a plurality of FETs each with a gate connected to its drain, and in this case, N times the threshold voltage (N is the number of the FETs with a gate connecting to its drain) will be produced at the output terminal 4. FIG. 2 illustrates one such embodiment.

The N channel MOS transistor 5 is a depletion type MOS FET in which a gate is connected to a source and the potential of the P type substrate is the same as that of the source. The N channel MOS transistor 7 is arranged so as to connect a gate to a drain and also to connect a P type substrate to a source. The node or point of connection 6 of the gate of the N channel MOS transistor 5 and the gate of N channel MOS transistor 7 is connected to the node or point of connection 8 of the source of N channel MOS transistor 5 and the drain of N channel MOS transistor 7.

In the embodiment shown in FIG. 2 a constant voltage is obtained between the node 8 and the terminal $V_{SS}$. The constant voltage is only slightly changed by a change in the source voltage applied across the terminals $V_{DD}$ and $V_{SS}$, or by a temperature change.

Figure 3:
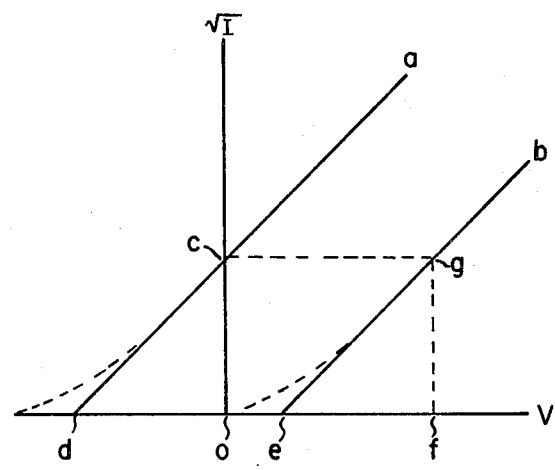
FIG. 3 is a graph of a current-voltage characteristic of the semiconductor device shown in FIG. 2; and, FIG. 4 is a circuit diagram of a conventional semiconductor device.

FIG. 3 illustrates a graph showing a relationship between the current and the voltage of the circuit illustrated in FIG. 2. For a MOS transistor which is under a saturation condition, the relationship will be defined by equation (1).

$$I = K(V_G - V_T)^2 \tag{1}$$

I; current flowing between source and drain
K; coefficient of conductivity
$V_G$; source-gate voltage
$V_T$; threshold voltage Assuming that the threshold voltage of the depletion type N channel MOS transistor 5 is $V_{T5}$, current $I_5$ of the N channel MOS transistor 5 and current $I_7$ of the N channel MOS transistor 7 are given by the following equations (2) and (3), respectively.

$$I_5 = K_5(V_{G5} - V_{T5})^2 \tag{2}$$

wherein $V_{G5}$ and $K_5$ are source-gate voltage of the transistor 5 and its coefficient of conductivity.

$$I_7 = K_7(V_{G7} - V_{T7}) \tag{3}$$

wherein $V_{G7}$, $K_7$ and $V_{T7}$ are source-gate voltage, coefficient of conductivity and threshold voltage of the transistor 7, respectively.

Since the $I_5$ is equal to the $I_7$ and $V_{G5}$ is zero, the required constant source-gate voltage $V_{G7}$ will be expressed by the following equation (4).

$$V_{G7} = -\sqrt{\frac{K_5}{K_7}} V_{T5} + V_{T7} \tag{4}$$

In FIG. 3, a straight line a shows the relationship of ($\sqrt{I}-V$) of the transistor 5 and a straight line b shows the relationship of ($\sqrt{I}-V$) of the transistor 7.

The length (c−o) in FIG. 3 shows the value of $I_5$ so that the length (g−f) indicative of $I_7$ becomes equal to $I_5$. Therefore, it follows that $V_{G7}$ of the equation (4) shows the voltage of the length (o−f) which is equal to the length (c−g). When $K_5 = K_7$ for the equation (4), $$V_{G7} = V_{T7} - V_{T5} \tag{5}$$

The voltage given by the equation (5) is equal to the sum of the voltage indicative of the length (d−o) and the voltage indicative of the length (o−e). Since it is not always necessary that the point e in FIG. 3 be in a positive region of voltage, the enhancement type transistor is not the only usable type, but the depletion type transistor is also usable. For the case of $K_5 = K_7$, it is understood from the equation (5) that a predetermined voltage can be obtained at the output terminal by controlling only the threshold voltages of the transistors 5 and 7. For the case of $K_5 \neq K_7$, the output voltage depends upon the equation (4) so that the control of a coefficient of conductivity will be required. Even if the power source voltage ($V_{DD} - V_{SS}$) is changed, the relationship of equation (4) is also applicable to the relationship of the source-gate voltage $V_{G7}$, which is an output voltage, as long as the voltage is kept greater than the source-drain voltage by which the transistor 5 operates under the saturation characteristic. Equation (6) gives the range of voltage required for producing a predetermined voltage.

$$V_{DD} - V_{SS} \geqq V_{T7} - 2V_{T5} \quad (6)$$

Now, features of the present device relating to its temperature characteristic will be described.

The temperature characteristic of an MOS transistor generally depends upon the temperature characteristics of threshold voltage and charge mobility. The term $(V_G - V_T)$ in equation (1) is related to the temperature characteristic of the threshold voltage. Since the value of $V_G$ is zero for the transistor 5 shown in FIG. 2 due to the direct connection between gate and source, the value of $(V_G - V_T)$ is equal to $-V_T$ and $-V_{T5}$. When $K_5$ is equal to $K_7$, the following relation for transistor 7 will hold from equation (5):

$$(V_G - V_7) = (V_{G7} - V_T) = (V_{T7} - V_{T5}) - V_{T7} = -V_{T5}$$

Therefore, the term of $(V_G - V_7)$ in equation (1) is under the same condition for transistors 5 and 7. That is, the change due to the temperature characteristic is extremely small because there is only the difference between the temperature characteristic of the threshold voltage depending upon a difference of concentration of a substrate necessary for provide a threshold voltage difference.

Now, consideration is made for charge mobility. In this case, the threshold voltages of transistors 5 and 7 are different since the impurity density of the substrate of transistor 5 is formed so as to be different from the impurity density of the substrate of transistor 7. Although the difference in the temperature characteristic of charge mobility due to the difference of the concentrations of substrates provides the change of the output voltage with temperature, the value of the change is extremely small. Therefore, in the device of the present invention, the change of output voltage due to a temperature change is extremely small. Next, a method for fabricating transistors which are different in threshold voltage will be described.

For the example illustrated in FIG. 2, as a first method, it will be obtained by forming the substrate for each of the transistors 5 and 7 with a different impurity density. In this case, since it is possible to change only the amount of ion implanted when fabricating P type substrate, the method of changing transistor threshold voltage by changing gate oxide thickness thereof is not used. Therefore, since the technique of changing gate oxide thickness is not used, the fabrication is substantially unaffected. As a second method, boron is also implanted into N channel transistor 7 at the same time when the boron is implanted into a gate for the purpose of controlling the threshold voltage of a P channel (not shown) in the fabricating process of C-MOS, so that the threshold level difference is produced between the transistor 7 and the non-implanted depletion transistor 5. According to this method, the addition of new steps is not required and only a change of the mask for implanting the ion into the P channel is required for fabricating. A third method is that the ion implantation is effected for each of the transistors 5 and 7 for obtaining different threshold voltage.

Although each method described above has various features relating to temperature characteristic, scattering of characteristics or the like, the device according to the present invention can be fabricated by any fabricating method described above without any major additional steps. The features of this device will be described as compared with the conventional one.

Figure 4:
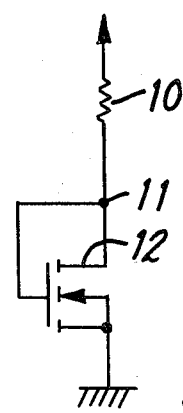

As shown in FIG. 4, a conventional voltage regulating circuit formed in a MOS integrated circuit is arranged in such a way that the voltage corresponding to the current flowing through a load 10 is produced at an output terminal 11 by utilizing a current-voltage characteristic of a MOS transistor 12. Therefore, when the load is changed in magnitude with a change of power source voltage, the output, level at the output terminal 11 is also changed. Since no operation for compensating for the change of load value due to temperature change is carried out, it is difficult to use the circuit for a higher accuracy constant voltage source. On the other hand, in the semiconductor device of the present invention, the current of the transistor 5 is scarcely changed by a change of power source voltage. Therefore, the source-drain voltage of the transistor 7 is not changed so that an excellent constant voltage characteristic will be obtained.

Since the conductivity type of the transistor 5 is the same as that of the transistor 7, the polarity of the temperature characteristic of transistor 5 is the same that of the transistor 7. Therefore, there is little difference in a temperature characteristic between them. If a coefficient of conductivity of the transistor 5 is the same as that of the transistor 7, a desired output voltage can be obtained by only controlling the difference in threshold voltage between the transistors 5 and 7, and it is easy to fabricate the device.

As shown in FIG. 5, the present device can produce an output voltage value equal to an integer multiple of a threshold voltage value. In FIG. 5, a transistor 13 is a depletion type transistor. Each threshold voltage of N channel MOS transistors 13 through 16 is represented by symbols $V_{T13}$ to $V_{T16}$. When all of the coefficients of conductivity $K_{12}$ through $K_{16}$ for N channel MOS transistors 13 through 16 have the same value, a voltage of $(V_{T16} - V_{T13}) + V_{SS}$ appears on an output terminal 20, voltage of $(V_{T16} + V_{T15} - 2V_{T13}) + V_{SS}$ on output terminal 19, and a voltage of $(V_{T16} + V_{T15} + V_{T14} - 3V_{T13}) + V_{SS}$ on output terminal 18. When $V_{T14}$, $V_{T15}$ and $V_{T16}$ are the same, voltages equal to two times the voltage and three times the voltage at the output terminal 20 are produced at the output terminals 19 and 18, respectively.

Although examples for obtaining a constant output voltage from the terminal of voltage $V_{SS}$ by utilizing an N channel transistor are illustrated in FIGS. 2 and 5, it is also possible to obtain a constant voltage output from the terminal of voltage $V_{DD}$ by utilizing an N channel transistor as shown in FIGS. 6 and 7 by only changing a connection. The number of transistors which can be connected between the terminal of voltage $V_{DD}$ and the terminal of voltage $V_{SS}$, can be chosen freely as long as the sum of the absolute values of the threshold voltages of the transistors does not exceed the value of $(V_{DD} - V_{SS})$. As illustrated in FIG. 8, when a depletion type MOS transistor, in which the gate is connected to the source, is arranged at any location between the terminal of voltage $V_{DD}$ and the terminal of voltage $V_{SS}$, a constant voltage from the terminal of voltage $V_{DD}$ and a constant voltage from the terminal of voltage $V_{SS}$ can be obtained at the same time. The above description of the present invention is made for the device employing N channel transistors, however, the device of the present invention can be also arranged by employing P channel transistors. These examples are illustrated in FIGS. 9 through 13.

It is features of the present invention that a constant voltage can be obtained in a stable condition without a substantial change of the conventional fabrication process of the device. Furthermore, since the constant voltage output can be obtained in such a way that the terminal of voltage $V_{DD}$ or voltage $V_{SS}$ is a reference level and the integer multiple voltage of a unit voltage can be obtained, the output voltage can be obtained with a higher degree of freedom. An extremely lower current is required for producing a constant voltage since each element is connected in series and only one current path is required between the terminal of voltage $V_{DD}$ and the terminal of voltage $V_{SS}$. As a result, the device is of use for the electronic circuit operated by a battery, to which a constant voltage source requiring large current for performing a voltage regulating operation is not applicable. Moreover, since the device can be fabricated by the conventional monolithic technique, it is possible to incorporate the device into the conventional MOS integrated circuit. Due to less current consumption, when the device is applied to an electronic timepiece which is small in battery capacity, remarkable effects will be obtained. Since the device of the present invention is fabricated by using a stable process constant, when the device is utilized for a conventional constant voltage source, reference voltage source or voltage detection circuit, in which conventional resistors, transistors or diodes are used, the present invention makes it possible to realize the device having advantages of low adjusting cost, stable a temperature characteristic, less current consumption and low production cost.

What is claimed:
1. A semiconductor device, comprising:
  a depletion type MOS field effect first transistor comprised of a substrate having formed thereon a gate, a source and a drain of said first transistor, wherein said first transistor gate is connected to said first transistor source and said first transistor source is connected to said first transistor substrate;
  a MOS field effect second transistor having the same conductivity type as said first transistor and comprised of a substrate having formed thereon a gate, a source and a drain of said second transistor, wherein said second transistor gate is connected to said second transistor drain and said transistor source is connected to said second transistor substrate; and
  said first and said second transistors are connected with their respective source-drain channels in series, and a respective one of the source and drain of said second transistor defining a power terminal of the device.

2. A semiconductor device according to claim 1, further comprising:
  a MOS field effect third transistor having the same conductivity type as said first transistor and comprised of a substrate having formed thereon a gate, a source and a drain of said third transistor, wherein said third transistor gate is connected to said third transistor drain and said third transistor source is connected to said third transistor substrate; and
  said first, said second and said third transistor are connected with their respective source-drain channels in series, with a respective one of the source and drain of said third transistor connected to said first transistor and with the other of the source and drain of said third transistor defining a second power terminal of the device.

* * * * *